United States Patent [19]

Saruwatari

[11] Patent Number: 5,243,570
[45] Date of Patent: Sep. 7, 1993

[54] SEMICONDUCTOR MEMORY DEVICE HAVING REDUNDANT MEMORY CELL COLUMNS CONCURRENTLY ACCESSIBLE TOGETHER WITH REGULAR MEMORY CELL ARRAYS

[75] Inventor: Yasuhiro Saruwatari, Tokyo, Japan
[73] Assignee: NEC Corporation, Tokyo, Japan
[21] Appl. No.: 11,815
[22] Filed: Feb. 1, 1993
[30] Foreign Application Priority Data
  Jan. 31, 1992 [JP] Japan .................... 4-015708
[51] Int. Cl.⁵ .................... G11C 5/06; G11C 29/00
[52] U.S. Cl. ......................... 365/201; 365/63; 365/189.01; 365/225.7; 365/230.03; 365/230.06; 371/10.1
[58] Field of Search ............. 365/201, 63, 230.03, 365/189.01, 230.06, 225.7; 371/10.1

[56] References Cited

U.S. PATENT DOCUMENTS 4,703,453 10/1987 Shinoda et al. .................... 365/201
4,914,632 4/1990 Fujishima et al. .................. 365/201
5,126,973 6/1992 Gallia et al. ...................... 365/230.03
5,132,928 7/1992 Hayashikoshi et al. ......... 365/230.03
5,172,335 12/1992 Sasaki et al. ........................ 365/63
5,193,074 3/1993 Anami .............................. 365/230.03

Primary Examiner—Joseph E. Clawson, Jr.
Attorney, Agent, or Firm—Sughrue, Mion, Zinn, Macpeak & Seas

[57] ABSTRACT

A semiconductor memory device is rescued from a defective product by replacing a column of regular memory cells containing a defective memory cell with a column of redundant memory cells, and allows a multi-bit data code to be read out partially from regular memory cell arrays as well as partially from the column of the redundant memory cells by permanently disabling a regular column address decoder circuit associated with the column of the regular memory cells replaced with the column of the redundant memory cells so that the other memory cell arrays and the column of the redundant memory cells become concurrently accessible.

7 Claims, 7 Drawing Sheets

SEMICONDUCTOR MEMORY DEVICE HAVING REDUNDANT MEMORY CELL COLUMNS CONCURRENTLY ACCESSIBLE TOGETHER WITH REGULAR MEMORY CELL ARRAYS

FIELD OF THE INVENTION

This invention relates to a semiconductor memory device and, more particularly, to a semiconductor memory device having redundant memory cells replaceable with defective memory cells.

DESCRIPTION OF THE RELATED ART

A typical example of the semiconductor memory device is illustrated in FIG. 1 of the drawings. The prior art semiconductor memory device stores 4-bit data codes in four regular memory cell arrays 1a to 1d each assigned to one of the four bits of each data code. The four regular memory cell arrays 1a to 1d are respectively accompanied with four redundant memory cell arrays 2a to 2d, and the four regular memory cell arrays 1a to 1d and the four redundant memory cell arrays 2a to 2d form a memory cell block 1. The prior art semiconductor memory device has a plurality of memory blocks, and a block selecting signal BS selects one of the memory cell blocks. The plurality of memory cell blocks are similar in arrangement to one another, and, for this reason, description is made on the memory cell block 1 for the sake of simplicity.

Each of the regular memory cell arrays 1a to 1d is fabricated from a large number of regular memory cells. In this instance, the regular memory cells are arranged in thirty-two columns, and each column contains a predetermined number of regular memory cells. The thirty-two columns of the regular memory cells are divided into eight column groups so that each column group consists of four columns. Thirty-two digit lines are respectively associated with the thirty-two columns, and are also divided into eight digit line groups D1, D2, ... and D8. The other regular memory cell arrays are similarly arranged, and each of the other regular memory cell arrays is also associated with eight digit line groups. Therefore, the prior art semiconductor memory device has thirty-two regular memory cell column groups respectively coupled with thirty-two digit line groups D1 to D32. The thirty-two digit line groups D1 to D32 are respectively terminated at thirty-two regular column selector circuits S1 to S32, and propagate data bits between the regular column selector circuits S1 to S32 and regular memory cells selected by word lines (not shown).

Each of the redundant memory cell arrays 2a to 2d is fabricated from redundant memory cells arranged in four columns, and each of the four columns consists of the predetermined redundant memory cells. The four columns of the redundant memory cells are coupled with four redundant digit lines, respectively, and the four redundant digit lines form in combination a redundant digit line group. Therefore, four redundant digit line groups are respectively associated with the four redundant memory cell arrays 2a to 2d, and are labeled with RD1 to RD4. The four redundant digit line groups RD1 to RD4 are respectively terminated at four redundant column selector circuits RS1 to RS4, and propagate data bits between the associated redundant column selector circuits RS1 to RS4 and redundant memory cells selected by the word lines (not shown) shared with the regular memory cell arrays 1a to 1d. Four input/output data lines I01 to I04 are respectively associated with the regular memory cell arrays 1a to 1d as well as with the redundant memory cell arrays 2a to 2d. The four input/output data lines I01 to I04 are coupled with four input/output data buffer circuits (not shown), and the other ends are respectively bifurcated so as to be coupled with the associated regular column selector circuits S1 to S8, ... and S25 to S32 and with the associated redundant column selector circuits RS1 to RS4.

The regular memory cell arrays 1a to 1d and the redundant memory cell arrays 2a to 2d are assisted by an addressing unit broken down into a row addressing sub-unit and a column addressing sub-unit. The row addressing sub-unit selectively drives the word lines (not shown) for selecting accessible regular and redundant memory cells. However, the row addressing sub-unit is less important for understanding problems inherent in the prior art semiconductor memory device, and no further description is incorporated hereinbelow. A block decoder circuit is further incorporated in the prior art semiconductor memory device for addressing one of the memory cell blocks. However, any description is not incorporated hereinbelow with the same reason as the row addressing sub-unit.

A column addressing signal consisting of column address bits Y0, Y1, Y2, Y3 and Y4 is supplied to the column addressing sub-unit, and the column addressing sub-unit comprises an address predecoder circuit 3 responsive to the column address bits Y0 and Y1 for producing address predecoded signals YA1 to YA4. The address predecoded signals YA1 to YA4 are indicative of one of the four regular bit lines of each regular bit line group as well as one of the four redundant bit lines of each redundant bit line group.

The column addressing sub-unit further comprises thirty-two regular column address decoder circuits DC1 to DC32 respectively associated with the regular column selector circuits S1 to S32, and four redundant column address decoder circuits RDC1 to RDC4 respectively associated with the four redundant column selector circuits RS1 to RS4, and the address predecoded signals YA1 to YA4 are distributed to the regular and redundant column address decoder circuits DC1 to DC32 and RDC1 to RDC4.

In order to select four regular column address decoder circuits, the column addressing sub-unit has a regular address predecoder circuit 4, and the regular address predecoder circuit 4 is either enabled or disabled with a redundant address predecoder circuit 5 accompanied with a program circuit 6. While the redundant address predecoder circuit 5 enables the regular address predecoder circuit 4 without a disable signal RNA, the regular address predecoder circuit 4 is responsive to the column address bits Y2 to Y4, and produces address predecoded signals DS1 to DS8 indicative of one of the eight regular column address decoder circuits DC1 to DC8, ... or DC25 to DC32 associated with each regular memory cell array 1A, ... or 1d. Since four regular memory cell arrays 1a to 1d are incorporated in the prior art semiconductor memory device, four regular column address decoder circuits are selected by the regular address predecoder circuit 4. The selected four regular column address decoder circuits become responsive to the address predecoded signal YA1 to YA4, and allows the associated regular column selector circuits to couple the four regular bit lines with the input/output data lines I01 to I04, respectively.

However, if the redundant address predecoder circuit 5 supplies the disable signal RNA to the regular address predecoder circuit 4, the regular address predecoder circuit 4 becomes irresponsive to the column address bits Y2 to Y4, and all of the regular column address decoder circuits DC1 to DC32 remain inactive. The redundant address predecoder circuit 5 further produces an enable signal RA complementary to the disable signal NRA, and the enable signal RA is supplied to the redundant column address decoder circuits RDC1 to RDC4. With the enable signal RA, the redundant column address decoder circuits RDC1 to RDC4 are activated, and become responsive to the address predecoded signals YA1 to YA4. In other words, each of the redundant column address decoder circuits RDC1 to RDC4 allows the associated redundant column selector circuit RS1 to RS4 to couple the redundant digit line indicated by the address predecoded signals YA1 to YA4 with the associated input/output data line I01, .. or I04, and four redundant digit lines are simultaneously coupled with the input/output data lines I01 to I04.

The program circuit 6 instructs the redundant address predecoder circuit 5 whether to permit the regular address predecoder circuit 4 to respond or to active the redundant column address decoder circuit RDC1 to RDC4. Assuming now that a defective memory cell is found in a diagnostic operation, the manufacturer replaces the four columns of the regular memory cells containing the defective memory cell with the associated redundant memory cell array. As described hereinbefore, the redundant address predecoder circuit 5 simultaneously activates all of the redundant column address decoder circuits RDC1 to RDC4, and, for this reason, the manufacturer needs to replace corresponding four columns of each of the regular memory cell arrays with the associated redundant memory cell arrays.

Turning to FIG. 2 of the drawings, a detailed circuit arrangement is illustrated, and is common to all of the regular column address decoder circuits DC1 to DC32. The redundant column address decoder circuits RDC1 to RDC4 are analogous in arrangement to the regular column address decoder circuits DC1 to DC32, and, for this reason, references enclosed in parenthesis are indicative of the corresponding signals for the redundant column address decoder circuits RDC1 to RDC4. The regular column address decoder circuit DCi shown in FIG. 2 comprises p-channel enhancement type load transistors Qp1 to Qp4 having source nodes coupled with a power voltage line Vcc and gate electrodes coupled with a ground voltage line, n-channel enhancement type switching transistors Qn5 to Qn8 having source-to-drain paths coupled between the drain nodes of the p-channel enhancement type load transistors Qp1 to Qp4 and a common node N1, two n-channel enhancement type switching transistors Qn9 and Qn10 coupled in series between the common node N1 and the ground voltage line, and inverter circuits IV1 to IV4 coupled with the drain nodes of the p-channel enhancement type load transistors Qp1 to Qp4. The n-channel enhancement type switching transistors Qn9 and Qn10 are respectively gated with the column selecting signal BS and one of the address predecoded signals DSj (where j stands for one of "1" to "8"), and allow the regular column address decoder circuit DCi to become responsive to the address predecoded signals YA1 to YA4. However, if the accessed memory cell is not incorporated in the memory cell block 1 or the regular address predecoder circuit 4 selects another regular column address decoder, one of the n-channel enhancement type switching transistors Qn9 and Qn10 is turned off, and the regular column address decoder circuit DCi never responds to the address predecoded signals YA1 to YA4. The address predecoded signals YA1 to YA4 are respectively supplied to the gate electrodes of the n-channel enhancement type switching transistors Qn5 to Qn8, and selectively turn on and off. Since the p-channel enhancement type load transistors Qp1 to Qp4 are turned on at all times, the voltage levels at the input node of the inverter circuits IV1 to IV4 are determined by the states of the n-channel enhancement type switching transistors Qn5 to Qn8, and one of the inverter circuits IV1 to IV4 swings one of the address decoded signals YB1 to YB4 to the active level.

In order to decrease parasitic capacitance coupled with each signal line for the address predecoded signal YA1, YA2, YA3 or YA4, the signal line is coupled with the one of the n-channel enhancement type switching transistor Qn5 to Qn8, and the associated p-channel enhancement type load transistor is turned on at all times. In this arrangement, the channel resistances of the component transistors Qp1 to Qp4 and Qn5 to Qn10 need to be exactly adjusted to design values, and the transistor sizes should be optimized so as to satisfy the following inequality.

$$(r2+r3+r4) \times Vcc/(r1+r2+r3+r4) < V1$$

where r1 is the channel resistance of each load transistor Qp1, . . . or Qp4, r2 is the channel resistance of each switching transistor Qn5, . . . or Qn8, r3 is the channel resistance of the switching transistor Qn9, r4 is the channel resistance of the switching transistor Qn10, and V1 is the threshold of each inverter circuit IV1, . . . or IV4.

A problem is encountered in the prior art semiconductor memory device in low production yield. In detail, as described hereinbefore, associated four columns of the regular memory cells of each regular memory cell array are simultaneously replaced with the associated redundant memory cells even if only one defective memory cell is incorporated in the four columns of the regular memory cells. In other words, only one defective memory cell requests the manufacturer to replace sixteen columns of the regular memory cells with the four redundant memory cell arrays 2a to 2d for rescuing the prior art semiconductor memory device. However, a defective memory cell takes place not only in the regular memory cell arrays 1a to 1d but also in the redundant memory cell arrays 2a to 2d. If a defective memory cell is incorporated in the other three redundant memory cell arrays for the twelve columns of the excellent regular memory cells, the replacement can not rescue the semiconductor memory device, and the production yield is deteriorated by such a defective memory cell incorporated in the columns redundant memory cells.

SUMMARY OF THE INVENTION

It is therefore an important object of the present invention provide a semiconductor memory device which improves the production yield.

To accomplish the object, the present invention proposes to permanently disable a regular column address decoder associated with a defective memory cell.

In accordance with the present invention, there is provided a semiconductor memory device comprising: a) at least one memory cell block having a plurality of regular memory cell arrays and a plurality of redundant memory cell arrays respectively associated with the plurality of regular memory cell arrays, each of the regular memory cell arrays being implemented by a plurality of regular memory cells arranged in columns which form in combination a regular column group divided into a plurality of regular column sub-groups, each of the redundant memory cell arrays being implemented by a plurality of redundant memory cells arranged in columns which form in combination a redundant column group, a defective memory cells incorporated in the plurality of regular memory cell arrays being replaceable with one of the plurality of redundant memory cells; b) a plurality of regular data propagation paths respectively coupled with the columns of the regular memory cells of the plurality of regular memory cell arrays, and divided into a plurality of regular propagation path groups each associated with the regular column group, the data propagation paths of each regular propagation path group being divided into a plurality of regular propagation path sub-groups respectively associated with the regular column sub-groups; c) an addressing means responsive to a column address signal, and operative to produce a first address predecoded signal indicative of one of the regular propagation path sub-groups of each regular propagation path group and a second address predecoded signal indicative of one of the regular data propagation paths of each regular propagation path sub-group; d) a plurality of regular column selectors respectively coupled with the regular propagation path sub-groups, and divided into a plurality of regular selector groups each associated with the regular propagation path group, the plurality of regular column selectors being responsive to a regular address decoded signal for selectively coupling the plurality of regular data propagation paths with a data bus; e) a plurality of regular column address decoders respectively associated with the plurality of regular column selectors, and divided into a plurality of regular decoder groups respectively associated with the plurality of regular selector groups, the plurality of regular column address decoders selectively entering a recoverbly disabled state, an enabled state and a permanently disabled state, the plurality of regular column address decoders entering the enabled state in the presence of the first address predecoded signal so as to become responsive to the second address predecoded signals for supplying the regular address decoded signal produced on the basis of the second address predecoded signal to the associated regular column selectors, the plurality of regular column address decoders entering the recoverbly disabled state in the absence of the first address predecoded signal so as to remain irresponsive to the second address predecoded signal, each of the plurality of regular column address decoders entering the permanently disabled state when a breakable element incorporated therein is broken in the presence of at least one defective memory cell incorporated in the associated regular column sub-group; f) a plurality of redundant data propagation paths respectively coupled with the columns of the redundant memory cells, and divided into a plurality of redundant propagation path groups respectively associated with the plurality of redundant memory cell arrays, the second address predecoded signal being further indicative of one of the redundant data propagation paths of each redundant propagation path group; g) a redundant control means storing column addresses respectively assigned to defective memory cells, and operative to produce an enable signal when a external column address signal is indicative of one of the column addresses stored therein; h) a plurality of redundant column selectors respectively coupled with the plurality of redundant data propagation path groups, and responsive to a redundant address decoded signal for selectively coupling the redundant data propagation paths with the data bus; and i) a plurality of redundant column address decoders respectively associated with the plurality of redundant column selectors, and selectively entering a recoverable disabled state with a non-broken breakable element, an enable state with the non-broken breakable element and permanently disabled state with a broken breakable element, the plurality of redundant column address decoders being enabled with the enable signal so as to become responsive to the second address predecoded signal for producing the redundant address decoded signal on the basis of the second address predecoded signal the plurality of redundant column address decoders entering the recoverbly disabled state in the absence of the enable signal, the plurality of redundant column address decoders selectively entering the permanently disabled state if no defective memory cell is incorporated in the regular column sub-groups replaceable with the associated redundant memory cell arrays and a defective memory cell is incorporated in the regular column sub-group replaceable with non-associated redundant memory cell arrays.

BRIEF DESCRIPTION OF THE DRAWINGS

The feature and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
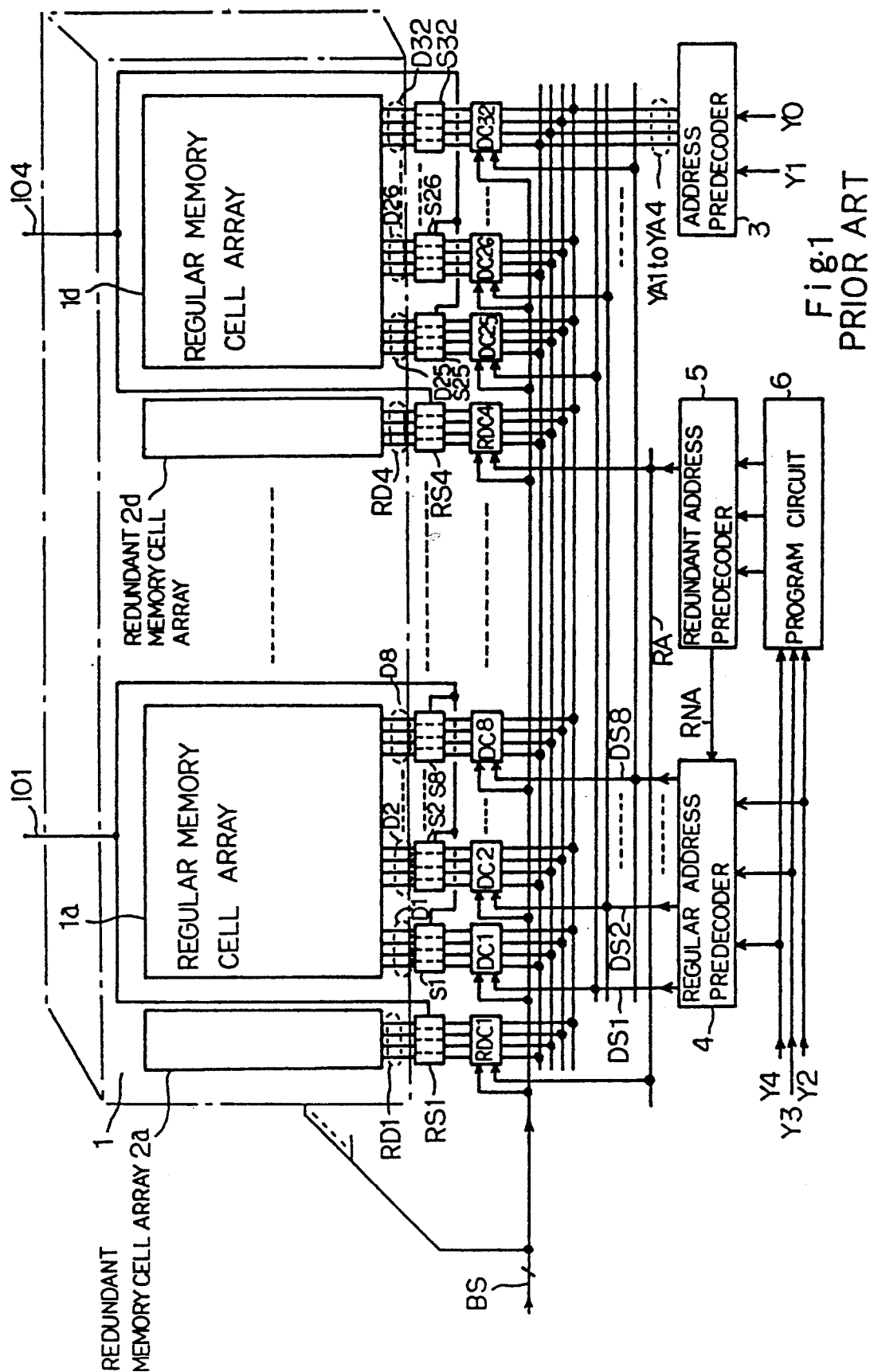
FIG. 1 is a block diagram showing the arrangement of the prior art semiconductor memory device.
Figure 2:
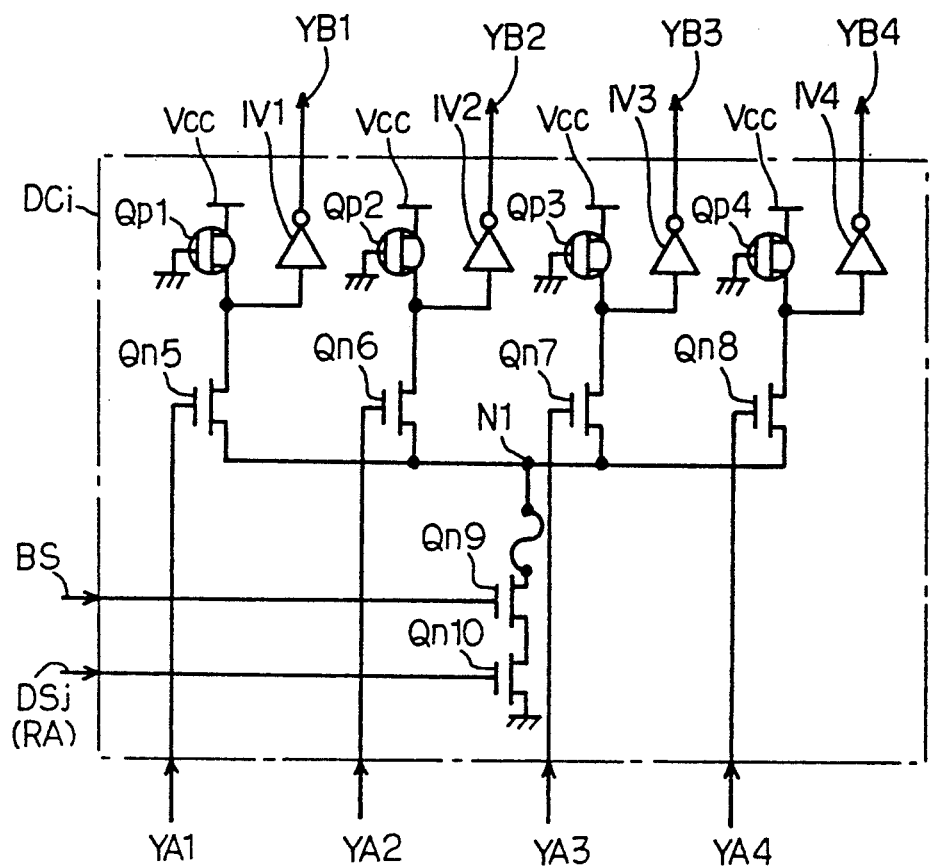
FIG. 2 is a circuit diagram showing the arrangement of the column address decoder circuit incorporated in the prior art semiconductor memory device.
Figure 3:
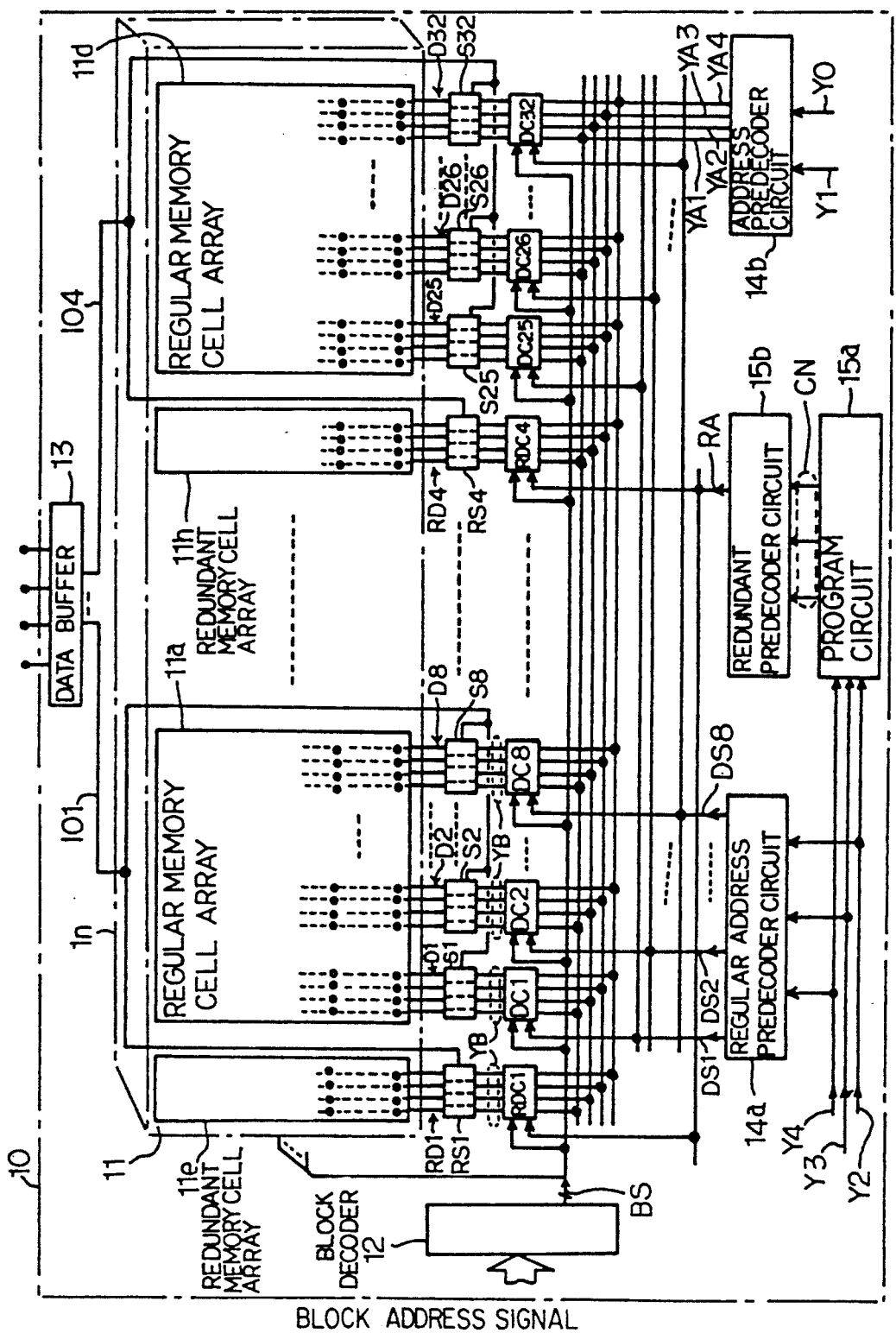
FIG. 3 is a block diagram showing the arrangement of a semiconductor memory device according to the present invention.

Referring to FIG. 3 of the drawings, a semiconductor memory device embodying the present invention is fabricated on a single semiconductor chip 11, and comprises a plurality of memory blocks 11 to 1n, and a block decoder circuit 12 is responsive to a block address signal for producing a block selecting signal BS indicative of one of the memory blocks 11 to 1n. The memory blocks 11 to 1n are similar in arrangement to one another, and, for this reason, description is made on the memory block 11 and the associated peripheral circuits only. However, the description is applicable to another memory block and the associated peripheral circuits.

The memory block 11 has four regular memory cell arrays 11a to 11d, and the four regular memory cell arrays 11a to 11d are respectively accompanied with four redundant memory cell arrays 11e to 11h. Each of the regular memory cell arrays 11a to 11d is fabricated from a large number of regular memory cells, and small bubbles stands for the individual regular memory cells. In this instance, the regular memory cells of the cell array 11a are arranged in thirty-two columns, and each column contains a predetermined number of regular memory cells. The thirty-two columns of the regular memory cells form in combination a regular column group, and are divided into eight regular column sub-groups so that each regular column sub-group consists of four columns of the regular memory cells. Thirty-two digit lines are respectively coupled with the thirty-two columns of the cell array 11a, and serves as regular data propagation paths. The thirty-two digit lines form in combination a regular digit line group corresponding to a regular propagation path group, and are also divided into eight digit line groups D1, D2, . . . and D8. The eight digit line groups D1 to D8 serve as regular propagation path sub-groups. The other regular memory cell arrays of the memory block 11 are similarly arranged, and each of the other regular memory cell arrays is also associated with eight digit line sub-groups. Therefore, the memory block has thirty-two regular column sub-groups respectively coupled with thirty-two digit line sub-groups D1 to D32.

The thirty-two digit line sub-groups D1 to D32 are respectively terminated at thirty-two regular column selector circuits S1 to S32, and propagate data bits between the regular column selector circuits S1 to S32 and regular memory cells selected by one of word lines (not shown). The thirty-two column selector circuits S1 to S32 are divided into four regular selector groups, and the four regular selector groups are respectively associated with the four regular digit line groups and, accordingly, the four regular memory cell arrays 11a to 11d.

Each of the redundant memory cell arrays 11e to 11h is fabricated from redundant memory cells arranged in four columns, and each of the four columns consists of the predetermined redundant memory cells. Small bubbles also stand for the individual redundant memory cells. The four columns of the redundant memory cells form in combination a redundant column group, and are coupled with four redundant digit lines, respectively. The four redundant digit lines form in combination a redundant digit line group corresponding to a redundant data propagation path group, and four redundant digit line groups RD1 to RD4 are respectively coupled with the redundant memory cell arrays 11e to 11h. The four redundant digit line groups RD1 to RD4 are respectively terminated at four redundant column selector circuits RS1 to RS4, and propagate data bits between the associated redundant column selector circuits RS1 to RS4 and redundant memory cells selected by the word line (not shown) shared with the regular memory cell arrays 11a to 11d. Four input/output data lines I01 to I04 are respectively associated with the regular memory cell arrays 11a to 11d as well as with the redundant memory cell arrays 11e to 11h. The four input/output data lines I01 to I04 are coupled with an input/output data buffer unit 13, and the other ends are respectively branched so as to be coupled with the associated regular column selector circuits S1 to S8, . . . . and S25 to S32 and with the associated redundant column selector circuits RS1 to RS4. The four input/output data lines I01 to I04 serve as a data bus.

The regular memory cell arrays 11a to 11d and the redundant memory cell arrays 11e to 11h are assisted by an addressing unit broken down into a row addressing sub-unit and a column addressing sub-unit. The row addressing sub-unit selectively drives the word lines (not shown) for selecting accessible regular and redundant memory cells. However, the row addressing sub-unit is less important for understanding a gist of the present invention, and no further description is incorporated hereinbelow.

The column addressing sub-unit corresponds to an addressing means, and comprises a regular address predecoder circuit 14a and an address predecoder circuit 14b. A column addressing signal consisting of column address bits Y0, Y1, Y2, Y3 and Y4 is distributed to the regular address predecoder circuit 14a and the address predecoder circuit 14b. The regular address predecoder circuit 14a is responsive to the column address bits Y2 to Y4, and produces a first address predecoded signal DS1 to DS8 indicative of one of the eight regular digit line sub-groups of each regular digit line group, and the first address predecoded signal DS1 to DS8 can select four digit line sub-groups from the four regular memory cell arrays 11a to 11d, respectively. The address predecoder circuit 14b is responsive to the column address bits Y0 and Y1 for producing a second address predecoded signal YA1 to YA4, and the predecoded signal YA1 to YA4 is indicative of one of the regular digit lines of each regular digit line sub-group as well as of one of the redundant digit lines of each redundant digit line group. When the first address predecoded signal is combined with the second address predecoded signal, four columns of the regular memory cells can be selected from the four regular memory cell arrays 11a to 11d or four columns of the redundant memory cells from the four redundant memory cell arrays 11e to 11h.

Thirty-two regular column address decoder circuits DC1 to DC32 are respectively coupled with the thirty-two regular column selector circuits S1 to S32, and are divided into four regular decoder groups. The block selecting signal BS, the first address predecoded signal DS1 to DS8 and the second address predecoded signal YA1 to YA4 are supplied to the individual thirty-two regular column address decoder circuits DC1 to DC32. As will be described hereinlater, the regular column address decoder circuits DC1 to DC32 are simultaneously selected by the block selecting signal BS, and one of the eight regular column address decoder circuits of each regular decoder group is enabled with the first address predecoded signal DS1 to DS8. The four regular column address decoder circuits are responsive to the second address predecoded signal YA1 to YA4, and produce column address decoded signals YB.

The four redundant column selector circuits RS1 to RS4 are respectively associated with four redundant column address decoder circuits RDC1 to RDC4, and are simultaneously enabled with a redundant control signal RA. When the redundant column address decoder circuits RDC1 to RDC4 are enabled, the redundant column address decoder circuits RDC1 to RDC4 are responsive to the second address predecoded signal YA1 to YA4, and produce the column address decoded signals.

The semiconductor memory device according to the present invention further comprises a redundant control unit having a program circuit 15a and a redundant predecoder circuit 15b. The program circuit 15a has a fuse array (not shown) selectively broken by, for example, a laser beam for memorizing a column address assigned to a regular column sub-group, and the column address bits Y2 to Y4 are compared with the column address stored in the fuse array. If the column address bits Y2 to Y4 are indicative of the column address stored in the fuse array, the program circuit 15a produces a consistent signal CN, and supplies the consistent signal CN to the redundant predecoder circuit 15b. With the consistent signal CN, the redundant predecoder circuit 15b produces the enable signal RA, and the enable signal RA is supplied to the redundant column address decoder circuits RDC1 to RDC4.

Figure 4:
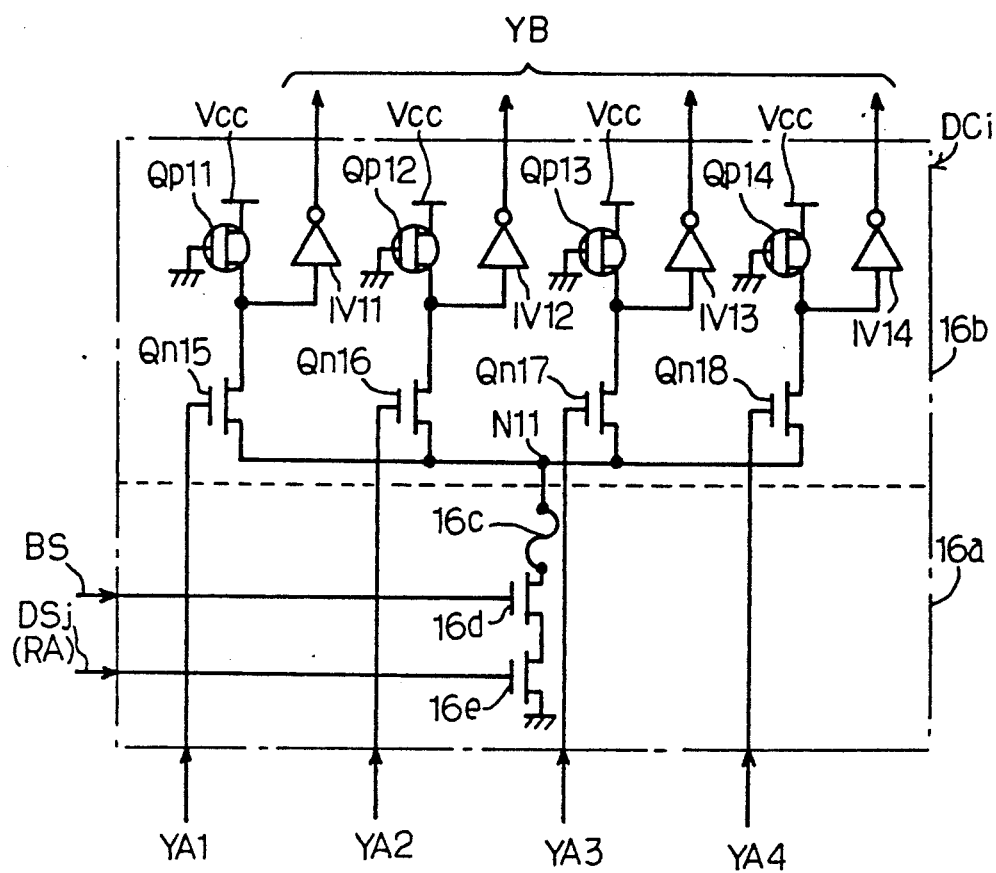
FIG. 4 is a circuit diagram showing the arrangement of a column address decoder incorporated in the semiconductor memory device.

Turning to FIG. 4 of the drawings, a detailed circuit arrangement is illustrated, and is common to all of the regular column address decoder circuits DC1 to DC32. The redundant column address decoder circuits RDC1 to RDC4 are analogous in arrangement to the regular column address decoder circuits DC1 to DC32, and, for this reason, references enclosed in parenthesis are indicative of the signal for the redundant column address decoder circuits RDC1 to RDC4. The regular column address decoder circuit DCi largely comprises a status control circuit 16a and a switching circuit 16b. The status control circuit comprises a fuse element 16c and two n-channel enhancement type switching transistors 16d and 16e coupled in series between a node N11 and a ground voltage line, and the block selecting signal BS and a bit DSj of the first address predecoded signal YB are respectively supplied to the gate electrodes of the n-channel enhancement type switching transistors 16d and 16e. The switching circuit 16b comprises p-channel enhancement type load transistors Qp11 to Qp14 having source nodes coupled with a power voltage line Vcc and gate electrodes coupled with the ground voltage line, n-channel enhancement type switching transistors Qn15 to Qn18 having source-to-drain paths coupled between the drain nodes of the p-channel enhancement type load transistors Qp11 to Qp14 and the node N11, and inverter circuits IV11 to IV14 coupled with the drain nodes of the p-channel enhancement type load transistors Qp11 to Qp14. The p-channel enhancement type load transistors Qp11 to Qp14 are turned on at all times, and the bits of the second address predecoded signal YA1 to YA4 are respectively supplied to the gate electrodes of the n-channel enhancement type switching transistors Qn15 to Qn18.

While the semiconductor memory device is subjected to inspections, all of the regular memory cell arrays of every memory block are examined to see whether or not a defective memory cell is incorporated therein. If no defective memory cell is found, any fuse element is not broken, and no column address is memorized in the program circuit 15a. On the other hand, if a defective memory cell is found in one of the regular column sub-groups, the column address assigned to the regular column sub-group is memorized in the program circuit 15a, and the fuse element of the associated regular column address decoder circuit is broken Moreover, the manufacturer breaks the fuse elements of the redundant column address decoders except for the redundant column address decoder circuit paired with the regular column address decoder circuit with the broken fuse element. For example, if a defective memory cell is incorporated in the leftmost regular column sub-group of the regular memory cell array 11a, the fuse element 16c of the regular column address decoder circuit DC1 is broken, and the fuse elements 16c of the redundant column address decoder circuits except for the redundant column address decoder circuit RDC1 are broken. However, the fuse elements of the other regular and redundant column address decoder circuits DC2 to DC32 and the RDC1 continuously conduct the nodes N1 and the n-channel enhancement type switching transistors 16d.

The semiconductor memory device thus arranged behaves as follows. Upon completion of the fabrication process, the semiconductor memory device is inspected to see whether or not any defective memory cell is incorporated in the memory blocks 11 to 1n. If any defective memory cell is not incorporated in the memory blocks 11 to 1n, the fuse array of the redundant predecoder circuit 15b is not broken, and, accordingly, the enable signal RA is never produced for any column address. In this situation, a data code stored in the leftmost regular columns of the respective regular memory cell arrays 11a to 11d is assumed to be accessed. The associated word line (not shown) allows the data code to be read out to the leftmost regular digit lines of the respective leftmost regular digit line sub-groups such as D1 and D25. Although the word line also allows the redundant memory cells to couple the associated redundant digit lines, the redundant column selector circuits RS1 to RS4 are never enabled, and block the input/output data lines I01 to I04 from the redundant digit lines.

The block address signal causes the block decoder circuit 12 to select the memory block 11, and the corresponding bit of the block selecting signal goes up to active high voltage level. The column address signal Y0 to Y4 indicative of the accessed data bit is decoded by the regular address predecoder circuit 14a and the address predecoder circuit 14b, and the regular address predecoder circuit 14a and the address predecoder circuit 14b allow the bit DS1 of the first address predecoded signal and the bit YA1 of the second address predecoded signal to go up to the active high voltage level. However, the program circuit 15a never permit the redundant predecoder circuit 15b to change the enable signal RA to the active high voltage level.

The block selecting signal BS and the bit DS1 allows the n-channel enhancement type switching transistors 16d and 16e of the leftmost regular column address decoder circuits such as DC1 and DC25 to turn on, and the n-channel enhancement type switching transistors Qn15 turn on in the presence of the bit YA1 of the active high voltage level. Therefore, these regular column address decoder circuits enter enabled state, however, the other regular column address decoder circuits remain recoverable disabled state. Then, current flows from the p-channel enhancement type load transistors Qp11 to the ground voltage line, and the drain nodes of the load transistors Qp11 to Qp14 is decayed under the threshold level of the associated inverter circuits IV11 to IV14. This results in that the leftmost bits of the respective column address decoded signals YB go up to the active high voltage level, and the leftmost regular column selector circuits such as S1 and S25 transfer the accessed data code to the input/output data lines I01 to I04. The data code is temporally stored in the data buffer unit 13, and is delivered to a destination.

On the other hand, a defective memory cell is found in the inspections, and is assumed to be incorporated in the leftmost regular column sub-group of the regular memory cell array 11a. The column address assigned to the left most regular column sub-group as well as the regular column address decoder circuit DC1 is stored in the program circuit 15a by selectively breaking the fuse array, and the manufacturer further breaks the fuse element 16c of the regular column address decoder circuit DC1 and the fuse elements 16c of the redundant column address decoder circuits except for that of the decoder circuit RDC1. In other words, the regular column address decoder circuit DC1 and the redundant column address decoder circuits except for RDC1 enter permanently disabled state. Therefore, the leftmost regular column sub-group of the array 11a is replaced with the redundant memory cell array 11e.

After the semiconductor memory device forms an electronic circuit together with other semiconductor devices such as a microprocessor, the address indicative of the defective memory cell is assumed to be accessed. The associated word line (not shown) allows a data code partially stored in the redundant memory cell of the leftmost redundant column and partially stored in the regular memory cells of the respective leftmost columns to be read out to the associated redundant digit line and the regular digit lines.

The block decoder circuit 12 selects the memory block 11, and changes the corresponding bit to the active high voltage level. The column address signal Y0 to Y4 allows the regular address predecoder circuit 14a and the address predecoder circuit 14b to change the bits DS1 and YA1 to the active high voltage level. Moreover, the program circuit 15a causes the redundant predecoder circuit 15b to change the enable signal RA to the active high voltage level. The regular address predecoder circuit 14a tries to enable the leftmost regular column address decoder circuits such as DC1 and DC25 with the bit DS1. However, the regular column address decoder circuit DC1 is permanently disabled due to the broken fuse element 16c, and the redundant column address decoder circuits except for RDC1 are also permanently disabled due to the broken fuse elements 16c. For this reason, the three leftmost regular column address decoder circuits except for DC1 are enabled with the block selecting signal BS and the bit DS1, and the leftmost regular column address decoder circuit DC1 remains in the disabled state in spite of the block selecting signal BS and the bit DS1. On the other hand, the enable signal RA allows the redundant column address decoder circuit RDC1 to enter the enabled state. However, the other three redundant column address decoder circuits are kept irresponsive to the second address predecoded signal YA1 to YA4 due to the broken fuse elements 16c. As a result, the redundant column address decoder circuit RDC1 changes the leftmost bit of the address decoded signal YB to the active high voltage level, and the leftmost regular column address decoder circuit DC1 keeps the address predecoded signal YB in the inactive low voltage level. However, the other three leftmost regular column address decoder circuits changes the respective leftmost bits of the address decoded signals YB to the active high voltage level. Then, the data bit is transferred from the leftmost redundant digit line of the group RD1 to the input/output data line I01, and the three bits are transferred from the leftmost digit lines of the leftmost regular digit line sub-groups such as D25 to the associated input/output data lines. Thus, the accessed data code is partially read out from the redundant memory cell array 11e and partially read out from the three regular memory cell arrays, and is delivered from the data buffer unit 13 to the destination.

If a write-in operation is carried out on the semiconductor memory device for a data code, the operational sequence is analogous from the above described read-out operation, and no further description is incorporated hereinbelow for the sake of simplicity.

As will be appreciated from the foregoing description, the regular column sub-groups are individually replaceable with the associated redundant column groups or the arrays 11e to 11h. This means even if a defective memory cell is incorporated in the redundant memory cell arrays not replaced with the excellent regular column sub-groups, the semiconductor memory device is diagnosed to be excellent product, and the production yield is surely enhanced.

Second Embodiment

Figure 5:
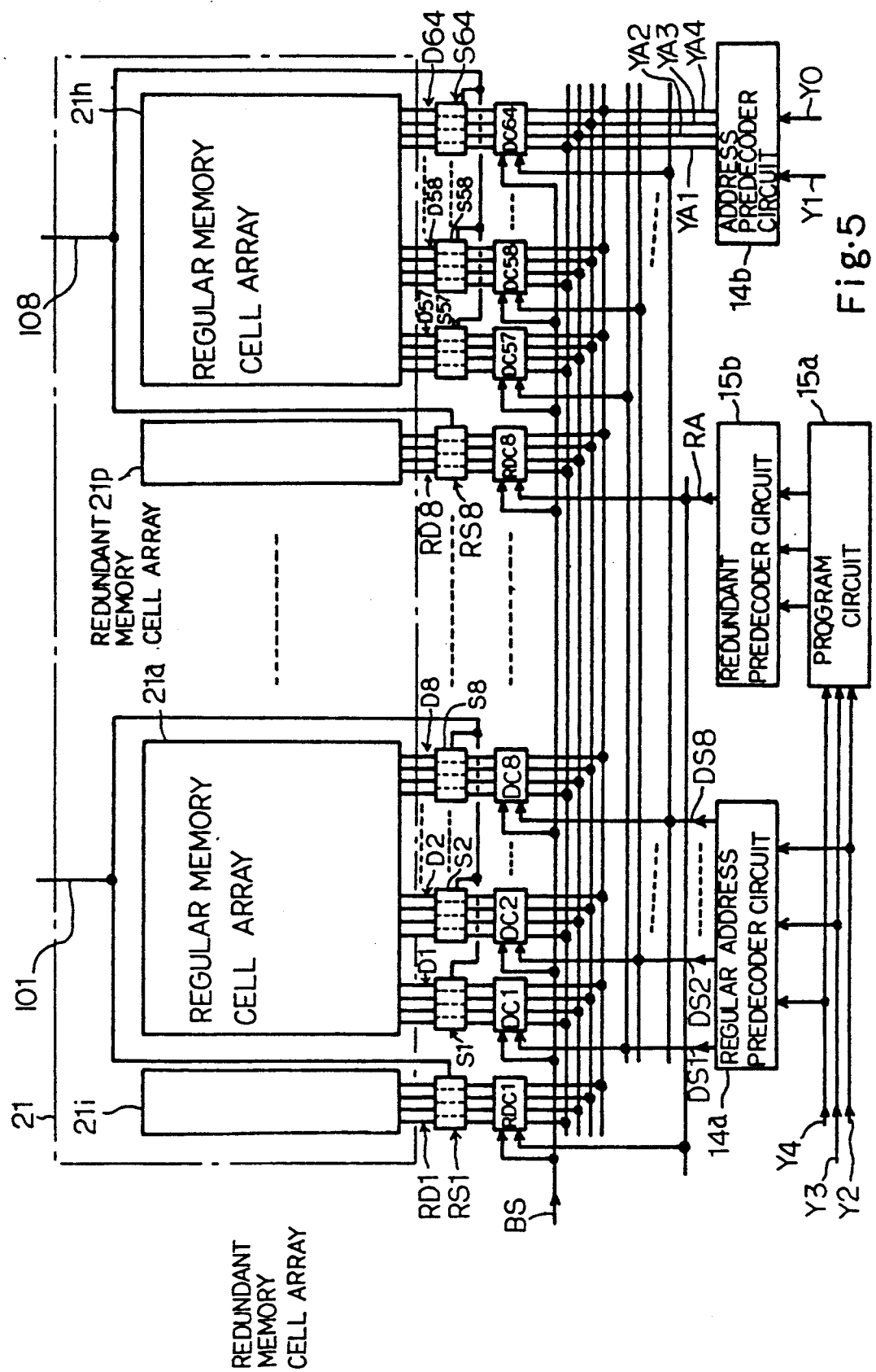
FIG. 5 is a block diagram showing the arrangement of another semiconductor memory device according to the present invention.

Turning to FIG. 5 of the drawings, another semiconductor integrated circuit device embodying the present invention is provided for an 8-bit data code, and each memory block 21 is implemented by eight regular memory cell arrays 21a to 21h respectively associated with eight redundant memory cell arrays 21i to 21p. However, the circuit arrangement and the functions thereof are analogous to the first embodiment, and, for this reason, the component circuits are labeled with similar references used for the first embodiment without detailed description.

If the component bits of the data code is increased, the advantage of the present invention becomes remarkable, and the production yield is drastically improved.

Third Embodiment

Figure 6:
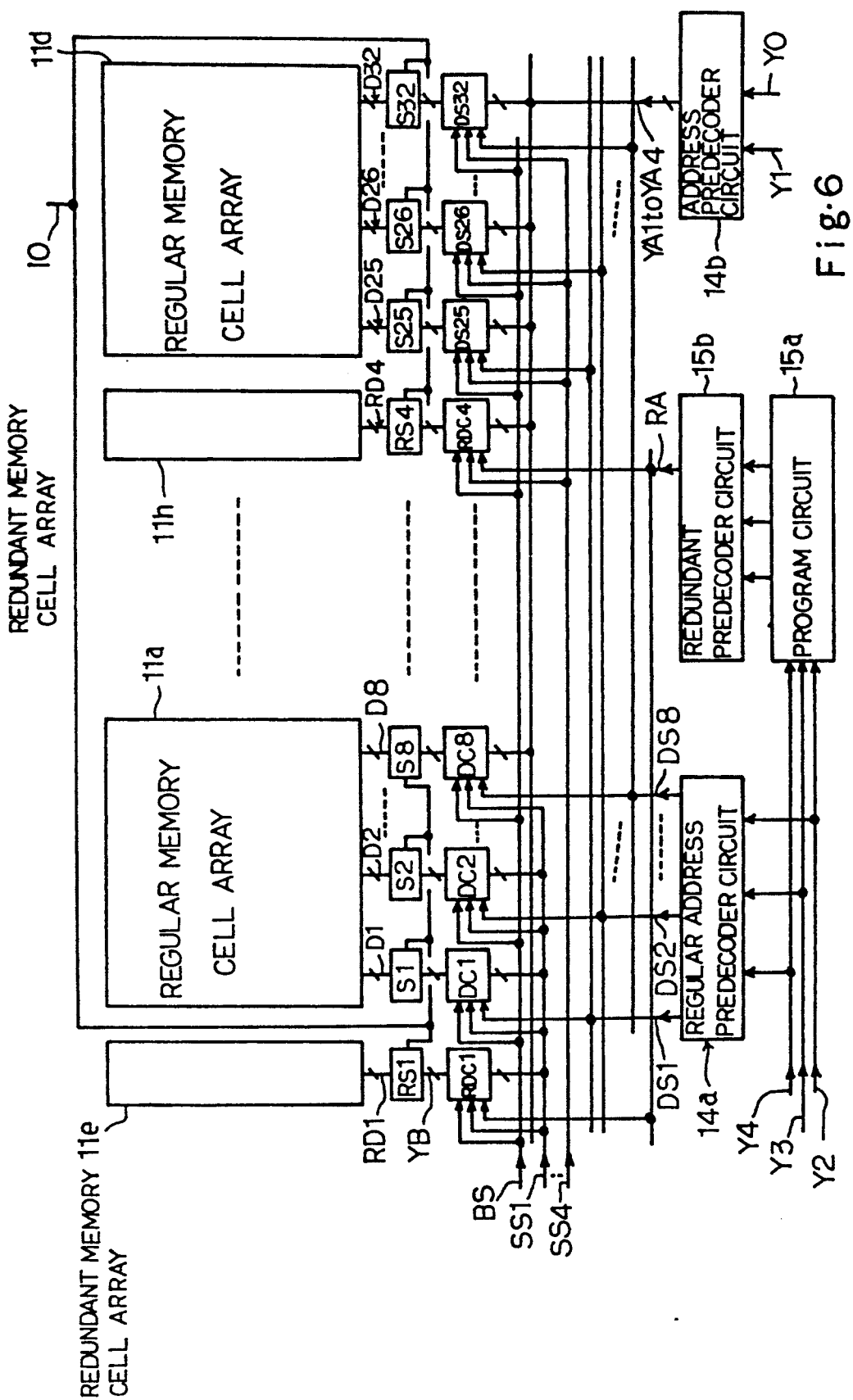
FIG. 6 is a block diagram showing the arrangement of yet another semiconductor memory device according to the present invention.
Figure 7:
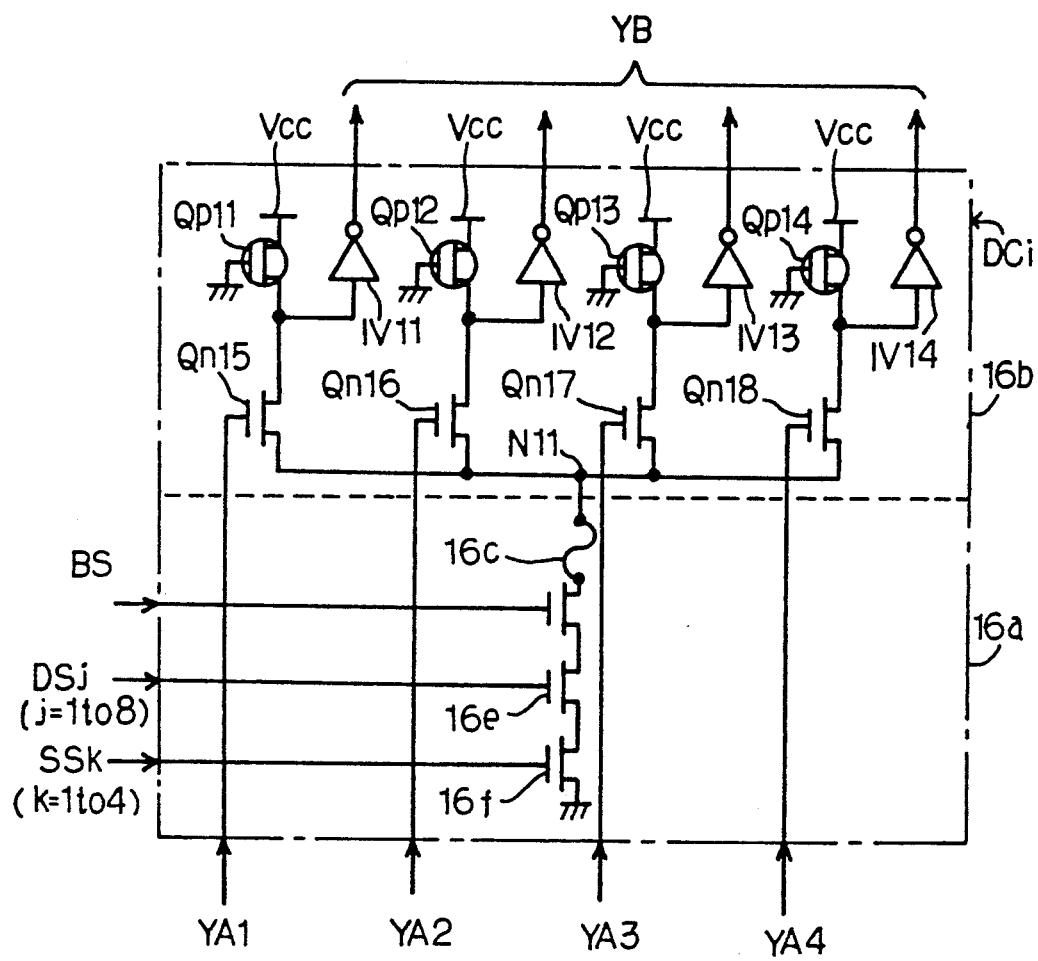
FIG. 7 is a circuit diagram showing the arrangement of a column address decoder circuit incorporated in the yet another semiconductor memory device.

Turning to FIG. 6 of the drawings, yet another semiconductor memory device embodying the present invention is provided for a single data bit. In order to select a single data bit, a 4-bit column address predecoded signal SS1 to SS4 is further supplied to regular column address decoder circuits DC1 to DC32 and to the redundant column address decoder circuits RDC1 to RDC4, and an n-channel enhancement type switching transistor 16f is further coupled between the n-channel enhancement type switching transistor 16e and the ground voltage line. However, the other component circuits are similar to those of the first embodiment, and the functions are analogous thereto. For this reason, the corresponding circuits are labeled with the same references, and no further description is incorporated hereinbelow for the sake of simplicity.

Although particular embodiments of the present invention have been shown and described, it will be obvious to those skilled in the art that various changes and modifications may be made without departing from the spirit and scope of the present invention. For example, the redundant technology according to the present invention is applicable to any type of semiconductor memory device such as, for example, a dynamic random access memory device, a static type random access memory device or an electrically erasable and programmable read only memory device. In the above described embodiments, each of the semiconductor memory devices has a plurality of memory blocks. However, another semiconductor memory device according to the present invention may contain only one memory block, and no block selecting signal is supplied to the regular and redundant column address decoder circuits.

What is claimed is:

1. A semiconductor memory device comprising:
   a) at least one memory cell block having a plurality of regular memory cell arrays and a plurality of redundant memory cell arrays respectively associated with said plurality of regular memory cell arrays, each of said regular memory cell arrays being implemented by a plurality of regular memory cells arranged in columns which form in combination a regular column group divided into a plurality of regular column sub-groups, each of said redundant memory cell arrays being implemented by a plurality of redundant memory cells arranged in columns which form in combination a redundant column group, a defective memory cells incorporated in said plurality of regular memory cell arrays being replaceable with one of said plurality of redundant memory cells;
   b) a plurality of regular data propagation paths respectively coupled with the columns of said regular memory cells of said plurality of regular memory cell arrays, and divided into a plurality of regular propagation path groups each associated with said regular column group, the data propagation paths of each regular propagation path group being divided into a plurality of regular propagation path sub-groups respectively associated with said regular column sub-groups;
   c) an addressing means responsive to a column address signal, and operative to produce a first address predecoded signal indicative of one of said regular propagation path sub-groups of each regular propagation path group and a second address predecoded signal indicative of one of the regular data propagation paths of each regular propagation path sub-group;
   d) a plurality of regular column selectors respectively coupled with the regular propagation path sub-groups, and divided into a plurality of regular selector groups each associated with said regular propagation path group, said plurality of regular column selectors being responsive to a regular address decoded signal for selectively coupling said plurality of regular data propagation paths with a data bus;
   e) a plurality of regular column address decoders respectively associated with said plurality of regular column selectors, and divided into a plurality of regular decoder groups respectively associated with said plurality of regular selector groups, said plurality of regular column address decoders selectively entering a recoverable disabled state, an enabled state and a permanently disabled state, said plurality of regular column address decoders entering said enabled state in the presence of said first address predecoded signal so as to become responsive to said second address predecoded signals for supplying said regular address decoded signal produced on the basis of said second address predecoded signal to the associated regular column selectors, said plurality of regular column address decoders entering said recoverbly disabled state in the absence of said first address predecoded signal so as to remain irresponsive to said second address predecoded signal, each of said plurality of regular column address decoders entering said permanently disabled state when a breakable element incorporated therein is broken in the presence of at least one defective memory cell incorporated in the associated regular column sub-group;
   f) a plurality of redundant data propagation paths respectively coupled with the columns of said redundant memory cells, and divided into a plurality of redundant propagation path groups respectively associated with said plurality of redundant memory cell arrays, said second address predecoded signal being further indicative of one of said redundant data propagation paths of each redundant propagation path group;
   g) a redundant control means storing column addresses respectively assigned to defective memory cells, and operative to produce an enable signal when an external column address signal is indicative of one of said column addresses stored therein;
   h) a plurality of redundant column selectors respectively coupled with said plurality of redundant data propagation path groups, and responsive to a redundant address decoded signal for selectively coupling said redundant data propagation paths with said data bus; and
   i) a plurality of redundant column address decoders respectively associated with said plurality of redundant column selectors, and selectively entering a recoverable disabled state with a non-broken breakable element, an enable state with the non-broken breakable element and permanently disabled state with a broken breakable element, said plurality of redundant column address decoders being enabled with said enable signal so as to become responsive to said second address predecoded signal for producing said redundant address decoded signal on the basis of said second address predecoded signal, said plurality of redundant column address decoders entering said recoverbly disabled state in the absence of said enable signal, said plurality of redundant column address decoders selectively entering said permanently disabled state if no defective memory cell is incorporated in the regular column sub-groups groups replaceable with the associated redundant memory cell arrays and a defective memory cell is incorporated in the regular column sub-group replaceable with non-associated redundant memory cell arrays.

2. A semiconductor memory device as set forth in claim 1, in which each of said regular and redundant column address decoders comprises a switching section responsive to said second address predecoded signal, and a status control section having said breakable element and responsive to said first address predecoded signal.

3. A semiconductor memory device as set forth in claim 2, in which said switching section comprises a plurality of normally-on type load transistors coupled with a power voltage line in parallel to one another, a plurality of first switching transistors coupled between said plurality of normally-on type load transistor and a common node in parallel to one another and having respective gate electrodes supplied with component bits of said second address predecoded signal, and a plurality of inverter circuits respectively coupled with drain nodes of said normally-on type load transistors.

4. A semiconductor memory device as set forth in claim 3, in which said status control section comprises said breakable element and a second switching transistor coupled in parallel between said common node and a constant voltage line, and one of the component bits of said first address predecoded signal is supplied to a gate electrode of said second switching transistor.

5. A semiconductor memory device as set forth in claim 4, in which said status control section further comprises a third switching transistor coupled between said breakable element and said second switching transistor, and a block selecting signal is supplied to a gate electrode of said third switching transistor.

6. A semiconductor memory device as set forth in claim 5, in which said status control section further comprises a fourth switching transistor coupled between said second switching transistor and said constant voltage line, and a component bit of a third address predecoded signal is supplied to a gate electrode of said fourth switching transistor so as to allow only one regular column address decoders or only one redundant column address decoders to enter said enabled state.

7. A semiconductor memory device as set forth in claim 1, in which said breakable element is implemented by a fuse element breakable in inspections before delivery from a manufacturer to see whether or not said defective memory cell is incorporated in said at least one memory block.

* * * * *